United States Patent [19]

Kobatake

[11] Patent Number: 5,729,155
[45] Date of Patent: Mar. 17, 1998

[54] HIGH VOLTAGE CMOS CIRCUIT WHICH PROTECTS THE GATE OXIDES FROM EXCESSIVE VOLTAGES

[75] Inventor: Hiroyuki Kobatake, Tokyo, Japan

[73] Assignee: NEC Corporation, Tokyo, Japan

[21] Appl. No.: 531,480

[22] Filed: Sep. 21, 1995

[30] Foreign Application Priority Data

Sep. 21, 1994 [JP] Japan ................... 6-225445

[51] Int. Cl.$^6$ ................................. H03K 19/0185
[52] U.S. Cl. ................. 326/68; 326/81; 326/121
[58] Field of Search ................. 326/80, 81, 62, 326/21, 24, 34, 83, 121, 68

[56] References Cited

U.S. PATENT DOCUMENTS

| | | | |
|---|---|---|---|
| 4,689,504 | 8/1987 | Raghunathan et al. | 326/81 |
| 5,191,233 | 3/1993 | Nakano | 327/333 |
| 5,243,236 | 9/1993 | McDaniel | 326/68 |
| 5,300,832 | 4/1994 | Rogers | 326/68 |
| 5,406,141 | 4/1995 | Yero et al. | 326/121 |
| 5,440,249 | 8/1995 | Schucker et al. | 326/81 |
| 5,465,054 | 11/1995 | Erhart | 326/121 |
| 5,473,268 | 12/1995 | Declercq et al. | 326/80 |
| 5,539,334 | 7/1996 | Clapp, III et al. | 326/68 |

FOREIGN PATENT DOCUMENTS

| | | |
|---|---|---|
| 62-149218 | 7/1987 | Japan . |
| 4-277920 | 10/1992 | Japan . |

OTHER PUBLICATIONS

Weste et al.; "Principles of CMOS VLSI Design, A Systems Perspective"; copyright 1985 by AT&T Bell Laboratories, Inc. and Kamran Eshraghian; pp. 9–10.

Primary Examiner—Edward P. Westin
Assistant Examiner—Benjamin D. Driscoll
Attorney, Agent, or Firm—Foley & Lardner

[57] ABSTRACT

In a voltage level shift circuit, a load device L11, a P-channel type MOS transistor P12 and N-channel type MOS transistors N12 and N11 are connected in series in the cited order between a high voltage source Vpp and GND. Voltages VMP and VMN having a level close to Vpp/2 are applied to the respective gates of the transistors P12 and N12 in order to suppress the level of the voltage to be applied to the gate oxide films of the MOS transistors.

12 Claims, 13 Drawing Sheets

| IN1A | IN1B | IN1C | OUT12 |
|---|---|---|---|
| L | L | L | HH |
| L | L | H | L |
| L | H | L | HH |
| L | H | H | L |
| H | L | L | HH |
| H | L | H | L |
| H | H | L | L |
| H | H | H | L |

HIGH VOLTAGE CMOS CIRCUIT WHICH PROTECTS THE GATE OXIDES FROM EXCESSIVE VOLTAGES

BACKGROUND OF THE INVENTION

The present invention relates to a voltage level shift circuit and, more particularly, to a high voltage level shift circuit necessary for controlling the operation of writing data onto a nonvolatile memory device with a high voltage by means of a low amplitude logic signal.

As shown in FIG. 14A of the accompanying drawings, a nonvolatile memory device typically comprises a memory cell array 81, a row decoder (X-decoder) 82 and a column decoder (Y-decoder) 83 for selecting a specific memory cell in the memory cell array 81 according to an externally supplied address, a sense amplifier 84 for reading out data stored in the selected memory cell and a write circuit 85 for writing data onto the selected memory cell. A power source voltage VDD (e.g., 5V) and a high voltage Vpp (e.g., 12V) necessary for writing the data are applied to the X-decoder 82, the Y-decoder 83 and the write circuit 85.

FIG. 14B illustrates a circuit diagram of a memory cell of the memory cell array 81 of FIG. 14A. VG=Vpp and VD=Vpp are applied if it is selected to store "1" in the selected memory cell, whereas VG=Vpp and VD=0V are applied if it is selected to store "0". If, on the other hand, it is not selected for storing the data, VG=0V is applied to the non-selected memory cell.

Thus, for writing the data in the nonvolatile memory device, the high voltage applied to the memory cells of the device has to be controlled by addresses and data to be written that has an amplitude shiftable between VDD and GDN (the ground potential). A level shift circuit is used to control the high voltage by means of a signal having an amplitude shiftable between VDD and GDN.

Japanese Patent Laid-open No. Heisei 4-277920 discloses a high voltage level shift circuit as shown in FIG. 8A comprising a serial circuit formed by connecting in series a low resistance resistor R31 that operates as a load device L31 and an N-channel type MOS transistor N31 having a gate to which an input signal IN3 is applied between a high voltage power supply terminal Vpp (hereinafter simply referred to as Vpp) and a grounding terminal GND (hereinafter simply referred to as GND), and another serial circuit formed by connecting in series a P-channel type MOS transistor P32 having its gate connected to a junction K of a resistor R31 and an N-channel type MOS transistor P32 and an N-channel type MOB transistor having a gate to which an inversion signal $\overline{IN3}$ obtained by inverting the input signal IN3 by means of an inverter I31 is applied also between Vpp and GND. Thus an output signal OUT31 is output from a junction of the P-channel type MOS transistor P32 and the N-channel type MOS transistor N32.

The above cited known high voltage level shift circuit operates in a manner as described below by referring to FIG. 8B. If the input signal IN3 is at "L" (or the ground potential level, hereinafter simply referred to as "L"), the N-channel type MOS transistor N31 is turned OFF and the potential of the junction K is raised to "HH" (or the Vpp potential level, hereinafter simply referred to as "HH"). Since the gate potential is at "HH", the P-channel type MOS transistor P32 is turned OFF and the inverted input signal $\overline{IN3}$ is at "H" (or the VDD potential level, hereinafter simply referred to as "H"), the N-channel type MOS transistor 32 turns ON to bring the output signal OUT31 to "L".

If, on the other hand, the input signal IN3 is at "H", the N-channel type MOS transistor N31 becomes ON and, therefore, if the ON-state resistance of the N-channel type MOS transistor N31 is much smaller than the resistance of the resistor R31, the junction K comes to "L". Additionally, since the gate potential is "L", the P-channel type MOS transistor P32 becomes ON and, because the input inversion signal $\overline{IN3}$ is at "L", the N-channel type MOS transistor 32 becomes OFF while the output signal OUT31 comes to "HH".

As described above, with a known high voltage level shift circuit as illustrated in FIG. 8A, an output signal OUT31 can be obtained either at "L" or at "HH" by controlling the high voltage with an input signal IN3 having an amplitude shiftable between VDD and GDN.

In addition, since the resistance of the resistor R31 is sufficiently higher than the ON-state resistance of the N-channel type MOS transistor N31 as described above, the junction K shows a high output impedance. So, if a low output impedance is not required, output signals can be output from the junction K so that the P-channel type MOS transistor P32, the N-channel type MOS transistor N32 and the inverter I31 may be omitted.

However, the high voltage Vpp is applied to the N-channel type MOS transistor N31 if the junction K is at "HH" and to the resistor R31 if the junction K is at "L". On the other hand, the high voltage Vpp is applied to the P-channel type MOS transistor P32 if the output signal OUT31 is at "L" and to the N-channel type MOS transistor N32 if the output signal OUT31 is at "HH". Thus, the resistor R31, the N-channel type MOS transistors N31 and N32 and the P-channel type MOS transistor P32 have to be designed to withstand a voltage as high as Vpp and typically require a number of additional manufacturing steps to make them withstand such a high voltage, making the overall manufacturing process rather complicated and hence costly.

Japanese Patent Laid-open No. Heisei 4-277920 discloses another high voltage level shift circuit as shown in FIG. 9A that comprises a serial circuit formed by connecting in series a P-channel type MOS transistor P41 and an N-channel type MOS transistor N41, having a gate to which an input signal IN4 is applied, between Vpp and GND, another serial circuit realized by connecting in series a P-channel type MOS transistor P42 and an N-channel type MOS transistor N42, having a gate to which an inversion signal $\overline{IN4}$ obtained by inverting the input signal IN4 by means of an inverter I41 is applied, also between Vpp and GND and a serial circuit formed by connecting in series a P-channel type MOS transistor P43 and an N-channel type MOS transistor, having a gate to which an input signal IN4 is applied, between Vpp and GND.

In this arrangement, the gate of the P-channel type MOS transistor P41 and that of the P-channel type MOS transistor P43 are connected to a junction M of the P-channel type MOS transistor P42 and the N-channel type MOS transistor N42, while the gate of the P-channel type MOS transistor P42 is connected to a junction L of the P-channel type MOS transistor P41 and the N-channel type MOS transistor N41. Thus an output inversion signal $\overline{OUT41}$ is output from a junction of the P-channel type MOS transistor P43 and the N-channel type MOS transistor N43.

Next an operation of the above cited known high voltage level shift circuit will be described with reference to FIG. 9B. If the input signal IN4 is at "L", the N-channel type MOS transistors N41 and N43 are turned OFF and the potential of the input inversion signal $\overline{IN4}$ comes to "H" so that the N-channel type MOS transistor N42 is turned ON to pull down the junction M to "L", while the P-channel type MOS transistors P41 and P43 are turned ON to pull up the junction L to "HH" so that the P-channel type MOS transistor P42 is turned OFF and the output inversion signal $\overline{OUT41}$ goes to "HH".

If, on the other hand, the input signal IN4 is at "H", the N-channel type MOS transistors N41 and N43 are turned ON and the potential of the input inversion signal $\overline{IN4}$ comes to "L" so that the N-channel type MOS transistor N42 is turned OFF to pull down the junction L and the output inversion signal OUT41 to "L", while the P-channel type MOS transistor P42 is turned ON to pull up the junction M to "HH" so that the P-channel type MOS transistors P41 and P43 are turned OFF.

As described above, with a known high voltage level shift circuit as illustrated in FIG. 9A, an output inversion signal $\overline{OUT41}$ can be obtained either at "L" or at "HH" by controlling the high voltage by means of an input signal IN4 having an amplitude shiftable between VDD and GDN. In addition, since the P-channel type MOS transistor P41 and the N-channel type MOS transistor N41, the P-channel type MOS transistor P42 and the N-channel type MOS transistor N42 and the P-channel type MOS transistor P43 and the N-channel type MOS transistor N43 are turned ON and OFF complementarily, no through current flows through the circuit and the circuit operates with a low power consumption rate.

Still additionally, since the potential of the junctions L and M pulled up by the P-channel type MOS transistors P41 and P42 has to be pulled down by the N-channel type MOS transistors N41 and N42, the ON-state resistance of the P-channel type MOS transistor P41 has to be set to a level much greater than the ON-state resistance of the N-channel type MOS transistor N41 and the ON-state resistance of the P-channel type MOS transistor P42 has to be set to a level much greater than the ON-state resistance of the N-channel type MOS transistor N42. Consequently, the output impedance of the junctions L and M are high but, if a low output impedance is not required, output signals can be output from the junctions L and M so that the P-channel type MOS transistor P43, and the N-channel type MOS transistor N43 may be omitted.

With this arrangement again, however, the high voltage Vpp is applied between the drain and the source of the N-channel type MOS transistor N41 and also of the N-channel type MOS transistor N42 if the junctions L and M are at "HH", while between the drain and source of the P-channel type MOS transistor P41 and also of the P-channel type MOS transistor P42 if the junctions L and M are at "L". On the other hand, the high voltage Vpp is applied between the drain and source of the N-channel type MOS transistor P43 if the output inversion signal $\overline{OUT41}$ is at "HH" and between the drain and source of the P-channel type MOS transistor P43 if the output inversion signal OUT31 is at "L". Thus, the P-channel type MOS transistors P41, P42 and P43 and the N-channel type MOS transistors N41, N42 and N43 have to be designed to withstand a voltage as high as Vpp and typically require a number of additional manufacturing steps to make them withstand such a high voltage, making the overall manufacturing process rather complicated and hence costly.

In order to cope with this problem, Japanese Patent Laid-open No. Showa 62-149218 proposes a voltage level shift circuit without MOS transistors which are designed to withstand a high voltage of the level under consideration.

FIG. 10A shows a circuit diagram of the proposed voltage level shift circuit. It comprises a serial circuit formed by connecting in series a P-channel type MOS transistor P51 having a gate to which an input signal I5 is applied, a P-channel type MOS transistor P52 and an N-channel type MOS transistor N52 having respective gates to which voltages VMP and VMN that are close to Vpp/2 are applied and an N-channel type MOS transistor N51 having a gate to which an input signal IN5 is applied, wherein the substrate electrode of the P-channel type MOS transistor P52 is connected to Vpp and the substrate electrode of the N-channel type MOS transistor N52 is connected to GND so that an output inversion signal $\overline{OUT51}$ is output from the junction of the P-channel type MOS transistor P52 and the N-channel type MOS transistor N52.

The circuit operation will be described below by referring to FIG. 10B. Firstly, if the input signal IN5 is at "L", the P-channel type MOS transistor P51 is turned ON to raise the junction N of the P-channel type MOS transistors P51 and P52 to "HH" and, at the same time, the N-channel type MOS transistor NS1 is turned OFF.

Since the junction N is at "HH", the P-channel type MOS transistor P52 is also turned ON to raise the output inversion signal OUT51 to "HH" if (Vpp)>(VMN+|VTP|) so that the junction O of the N-channel type MOS transistors N51 and N52 is pulled up to (VMN−VTN) via the N-channel type MOS transistor N52 to put it into a stable condition.

VTP denotes the threshold voltage of the P-channel type MOS transistor P52 but it generally denotes the threshold voltage of a P-channel type MOS transistor hereinafter. Likewise, VTN denotes the threshold voltage of the N-channel type MOS transistor N52 but it generally denotes the threshold voltage of an N-channel type MOS transistor.

On the other hand, if the input signal IN5 is at "HH", the N-channel type MOS transistor N51 is turned ON to bring the junction O to "L" and, at the same time, the P-channel type MOS transistor P51 is turned OFF. Since the junction O is at "L", the N-channel type MOS transistor N52 is also turned ON so that the output inversion signal $\overline{OUT51}$ is lowered to "L" and the junction N is pulled down to (VMP+|VTP|) via the P-channel type MOS transistor P52 to put it into a stable condition.

Even if the input signal IN5 is at "H" as indicated by a broken line, it would be apparent that the circuit operates in the similar manner to that if the input signal IN5 is at "HH" so long as the ON-state resistance of the P-channel type MOS transistor P51 is much larger than the ON-state resistance of the N-channel type MOS transistor N51+the ON-state resistance of the N-channel type MOS transistor N52 except the case where the P-channel type MOS transistor P51 is constantly kept on.

If the output inversion signal $\overline{OUT51}$ is at "HH", since a voltage equal to (Vpp−VMN+VTN) is applied between the drain and the source of the N-channel type MOS transistor N52 while a voltage equal to (VMN−VTN) is applied between the drain and the source of the N-channel type MOS transistor, there is no need of applying the high voltage if VMN is set at a value close to Vpp/2 so that the N-channel type MOS transistors N51 and N52 do not have to be designed to withstand a high voltage so long as the N-channel type MOS transistor N52 can withstand at least Vpp between the drain and the substrate.

If the output inversion signal $\overline{OUT51}$ is at "L", since a voltage equal to (VMP+|VTP|) and a voltage equal to (Vpp−VPM−|VTM|) are applied between the drain and the source of the P-channel type MOS transistor P52 and between the drain and source of the P-channel type MOS transistor P51 respectively, there is no need of applying a high voltage if VMP is set at a value close to Vpp/2 so that the P-channel type MOS transistors P51 and P52 do not have to be designed to withstand a high voltage so long as the drain of the P-channel type MOS transistor P52 can withstand at least Vpp.

FIG. 13 illustrates a circuit for generating VMP and VMN that comprises resistors R71 and R72 connected in series between Vpp and GND so that VMP and VMN can be output from a junction of the resistors R71 and R72. The values of VMP and VMN can be given by the following.

$$VMP=VMN=R71/(R71+R72) \qquad (1)$$

While VMP=VMN in the above circuit, it will be apparent that a similar effect can be obtained if VMP≠VMN so long as they are close to Vpp/2.

As described above, with the high voltage circuit of FIG. 10A, the high voltage of the level under consideration can be controlled by means of an input signal IN5 having an amplitude shiftable between VDD and GDN without using MOS transistors that are designed to withstand the high voltage to realize a voltage level shift circuit capable of outputting an output inversion signal $\overline{OUT51}$ of "L" and "HH".

Japanese Patent Laid-open No. Showa 62-149218 proposes another voltage level shift circuit without MOS transistors that can withstand a high voltage. FIG. 11A shows a circuit diagram of the proposed voltage level shift circuit. It comprises a serial circuit realized by connecting in series a P-channel type MOS transistor P61, a P-channel type MOS transistor P62 and an N-channel type MOS transistor N62 having respective gates to which voltages VMP and VMN that are close to Vpp/2 are applied, and an N-channel type MOS transistor N61 having a gate to which an input signal IN6 is applied between Vpp and GND and a serial circuit realized by connecting in series a P-channel type MOS transistor P63, a P-channel type MOS transistor P64 and an N-channel type MOS transistor N64 having respective gates to which voltages VMP and VMN that are close to Vpp/2 are applied, and an N-channel type MOS transistor N63, having a gate to which an inversion signal $\overline{IN6}$ obtained by inverting the input signal IN6 by means of an inverter I61 is applied, between Vpp and GND.

In this circuit, the gate of the P-channel type MOS transistor P61 is connected to the junction of the P-channel type MOS transistor P64 and the N-channel type MOS transistor N64, while the gate of the P-channel type MOS transistor P63 is connected to the junction of the P-channel type MOS transistor P62 and the N-channel type MOS transistor N62, whereas the substrate electrodes of the P-channel type MOS transistors P61 and P64 are connected to Vpp and those of the N-channel type MOS transistors N62 and N64 are connected to GND so that a pair of complementary output signals OUT61 are respectively output from the junction of the P-channel type MOS transistor P62 and the N-channel type MOS transistor N62 and that of the P-channel type MOS transistor P64 and the N-channel type MOS transistor N64.

The above described circuit operates in a manner as described below by referring to FIG. 11B. If the input signal IN6 is at "L", the N-channel type MOS transistor N61 becomes OFF to bring the inverted input inversion signal $\overline{IN6}$ to "H" so that the N-channel type MOS transistor N63 becomes ON to pull down the junction S of the N-channel type MOS transistors N63 and N64 to "L". If (VMN)> (VTN) under this condition, the N-channel type MOS transistor N64 also becomes ON to bring the output signal OUT61 to "L" and the junction R of the P-channel type MOS transistors P63 and P64 is pulled down to (VMP+|VTP|) by way of the P-channel type MOS transistor P64.

Since the output signal OUT61 is at "L", the P-channel type MOS transistor P61 is turned ON to pull up the junction P of the P-channel type MOS transistors P61 and P62 to "HH" and, if (Vpp–VMP)>|VTP|, the P-channel type MOS transistor P62 becomes ON to raise the output inversion signal $\overline{OUT61}$ to "HH" and the junction Q of the N-channel type MOS transistor N61 and N62 is pulled up to (VMN–VTN) by way of the N-channel type MOS transistor N62 to put it into a stable condition.

If, on the other hand, the input signal IN6 is at "H", the N-channel type MOS transistor N61 becomes ON to pull down the junction Q to "L" so that, if VMN>VTN, the N-channel type MOS transistor N62 also becomes ON to bring the output inversion signal $\overline{OUT61}$ to "L". Additionally, the junction P is pulled down to (VMP+|VTP|) by way of the P-channel type MOS transistor P62.

Still additionally, as the input inversion signal $\overline{IN6}$ goes to "L", the N-channel type MOS transistor N63 becomes OFF to bring the output signal OUT61 to "L" and turn the P-channel type MOS transistor P63 ON so that the junction R is pulled up to "HH" and, if (Vpp–VMP)>|VTP|, the P-channel type MOS transistor P64 is turned ON to bring the output signal OUT61 to "HH" and the P-channel type MOS transistor P61 turned OFF. At the same time, the junction S is pulled up to (VMN–VTN) by way of the N-channel type MOS transistor N64 to put it into a stable condition.

Here again, since a voltage equal to (Vpp–VMN+VTN) is applied between the drain and the source of the N-channel type MOS transistor N62 and also of the N-channel type MOS transistor N64, while a voltage equal to (VMN–VTN) is applied between the drain and the source of the N-channel type MOS transistor N61 and also of the N-channel type MOS transistor N63, no high voltage has to be used if a value close to Vpp/2 is selected for VMN so that the N-channel type MOS transistors N61, N62, N63 and N64 do not have to withstand a high voltage of the level under consideration if the drains of the N-channel type MOS transistors N62 and N64 can withstand at least Vpp.

Likewise, a voltage equal to (VMP+|VTP|) is applied between the drain and the source of the P-channel type MOS transistor P62 and of the P-channel type MOS transistor P64, while a voltage equal to (Vpp–VMP–|VTP|) is applied between the drain and the source of the P-channel type MOS transistor P61 and of the P-channel type MOS transistor P63, no high voltage has to be used if a value close to Vpp/2 is selected for VMN so that the P-channel type MOS transistors P61, P62, P63 and P64 do not have to withstand a high voltage of the level under consideration if the drains of the P-channel type MOS transistors P62 and P64 can withstand at least Vpp.

As described above, with a high voltage level shift circuit as illustrated in FIG. 11A, the high voltage of the level under consideration can be controlled by means of an input signal IN6 having an amplitude shiftable between VDD and GDN without using MOS transistors that are designed to withstand the high voltage to obtain a pair of complementary output signals OUT61 that are at "L" and "HH" respectively. In addition, since the P-channel type MOS transistor P61 and the N-channel type MOS transistor N61 and the P-channel type MOS transistor P63 and the N-channel type MOS transistor N63 are turned ON and OFF complementarily, no through current flows through the circuit and the circuit operates with a low power consumption rate.

U.S. Pat. No. 5,243,236 discloses a high voltage level shift circuit as shown in FIG. 12. Since this circuit differs from that of the above described FIG. 11A only in that the substrate electrodes of the P-channel type MOS transistors P62 and P64 are connected to the respective sources in the former, its components are denoted by reference symbols that are the same as those of FIG. 11A and will not be described here any further.

Since the substrate electrodes of the P-channel type MOS transistors P62 and P64 are connected to the respective sources in the circuit of FIG. 12, the voltage applied between the drain and the source equals to the voltage applied between the drain and the substrate so that the circuit advantageously operates properly even if each of the P-channel type MOS transistors P62 and P64 does not withstand Vpp between the drain and the substrate.

Otherwise, the circuit of FIG. 12 is substantially equivalent to that of FIG. 11A and, therefore, its components are denoted by reference symbols that are the same as those of FIG. 11A and will not be described here any further. While the substrate electrodes of the N-channel type MOS transistors N62 and N64 of the circuit of FIG. 12 are connected to GND and, therefore, the drains of the N-channel type MOS transistors N62 and N64 have to withstand a voltage equal to or greater than Vpp, it would be understood that the circuit operates properly if they withstand a voltage equal to or greater than (Vpp−VMN−VTN) when the substrate electrodes of the N-channel type MOS transistors N62 and N64 are connected to the respective sources.

When the input signal IN5 is at "L" or at the level of GND in the high voltage level shift circuit of FIG. 10A, the P-channel type MOS transistor P51 is turned ON to bring both the drain and the source to "HH" or to the level of Vpp so that the high voltage of Vpp is applied to the gate oxide film of the P-channel type MOS transistor P51.

However, as MOS transistors are downsized in recent years, their gate oxide films are made so thin that they are apt to be rapidly degraded and eventually destructed to make the entire circuit totally go out of order if subjected to an electric field as strong as 10 MV/cm.

With the known high voltage level shift circuit of FIG. 11A, both the drain and the source of the P-channel type MOS transistor P61 go up to Vpp so that Vpp is applied to the gate oxide film if the output signal OUT61 is at "L" whereas both the drain and the source of the P-channel type MOS transistor P63 go up to Vpp so that Vpp is applied to the gate oxide if the output inversion signal $\overline{\text{OUT61}}$ is at "L". Consequently, the gate oxide films are rapidly degraded and eventually destructed to make the entire circuit go out of order.

With the known high voltage level shift circuit of FIG. 12, Vpp is applied to the gate oxide films of the P-channel type MOS transistors P61 and P63 to rapidly degrade and destruct them, as in the case of the circuit of FIG. 11A, so that the entire circuit eventually goes out of order.

It will be apparent that Vpp is applied to the gate oxide film of the P-channel type MOS transistor P32 of the known high voltage level shift circuit of FIG. 8(a) and also to the gate oxide films of the P-channel type MOS transistors P41, P42 and P43 of the known high voltage level shift circuit of FIG. 9(a) and, therefore, a similar problem takes place in these circuits.

SUMMARY OF THE INVENTION

It is, therefore, an object of the present invention to provide a highly reliable voltage level shift circuit realized without using any MOS transistor which is designed to withstand a high voltage and hence never goes out of order because the gate oxide films of the MOS transistors are not degraded nor destructed.

According to the present invention, there is provided a voltage level shift circuit for generating, in response to a logical input having a given level of amplitude, a logical output with an amplitude of Vpp, which is greater than the logical input, comprising a load device, a first uniconductivity type MOS transistor having a gate to which a voltage substantially equal to Vpp/2 is applied, a second reverse-conductivity type MOS transistor having a gate to which a voltage substantially equal to Vpp/2 is applied and a third reverse-conductivity type MOS transistor having a gate to which said logical input is applied, the first through third MOS transistors being connected in series in the cited order between the power supply voltage Vpp and the ground and the logical output being taken out of the junction of the first and second MOS transistors.

According to another aspect of the present invention, there is provided a voltage level shift circuit for generating, in response to a logical input, a logical output having a given level of amplitude Vpp, which is greater than the logical input, comprising, a first uniconductivity type MOS transistor, a second uniconductivity type MOS transistor having a gate to which a voltage substantially equal to Vpp/2 is applied, a third reverse-conductivity type MOS transistor having a gate to which a voltage substantially equal to Vpp/2 is applied and a fourth reverse-conductivity type MOS transistor having a gate to which the logical input is applied, the first through fourth MOS transistors being connected in series in the cited order between the power supply voltage Vpp and the ground, and a fifth uniconductivity type fifth MOS transistor, a sixth uniconductivity type MOS transistor having a gate to which a voltage substantially equal to Vpp/2 is applied, a seventh reverse-conductivity type MOS transistor having a gate to which a voltage substantially equal to Vpp/2 is applied and an eighth reverse-conductivity type MOS transistor having a gate to which an inverted signal of the logical input is applied, the fifth through eighth MOS transistors being connected in series in the cited order between the power supply voltage Vpp and the ground, the gate of the first MOS transistor being connected to the junction of the fifth and sixth MOS transistors and the gate of the fifth MOS transistor being connected to the junction of the first and second MOS transistors so that a pair of complementary logical outputs being output from the junction of the second and third MOS transistors and that of the sixth and seventh MOS transistors.

In the present invention, a load device, a uniconductivity type MOS transistor having a gate to which a voltage substantially equal to a given high voltage is applied, a reverse-conductivity type MOS transistor having a gate to which a voltage substantially equal to the high voltage is applied and a reverse-conductivity type MOS transistor having a gate to which a logical input of a low level of amplitude is applied, are connected in series in the cited order between the high voltage and GND so that a low voltage may be applied to the gate oxide film of each of the MOS transistors.

Other objects and features will be clarified from the following description with reference to attached drawings.

DETAILED DESCRIPTION OF THE PREFERRED EMBODIMENTS

Figure 1A:
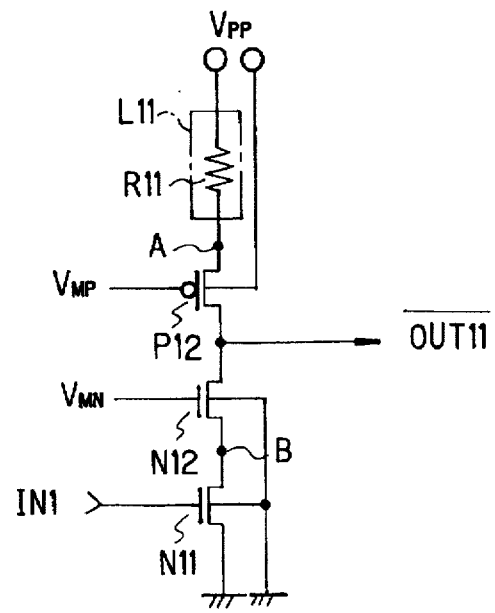
FIGS. 1A and 1B are a circuit diagram of a first embodiment and a timing chart for explaining the operation thereof according to the present invention.

FIG. 1A is a circuit diagram of a first embodiment according to the present invention. The circuit comprises, between the power supply voltage Vpp and GND, a resistor R11 that operates as a load device L11, a P-channel type MOS transistor P12 having a gate to which voltage VMP substantially equal to Vpp/2 is applied, an N-channel type MOS transistor N12 having a gate to which voltage VMN substantially equal to Vpp/2 is applied and an N-channel type MOS transistor N11 having a gate to which input signal IN1 is applied, all connected in series to form a serial circuit.

The substrate electrode of the P-channel type MOS transistor P12 and that of the N-channel type MOS transistor N12 are connected respectively to Vpp and GND and an output inversion signal $\overline{OUT11}$ is taken out of the junction of the P-channel type MOS transistor P12 and the N-channel type MOS transistor N12.

Figure 1B:
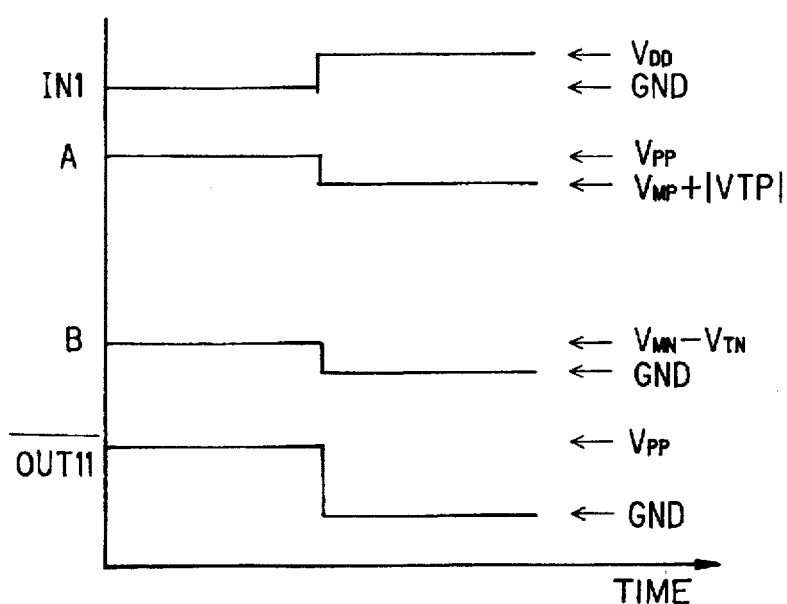

The above described circuit operates in a manner as described below by referring to Fig. 1B. Firstly, if the input signal IN1 is at "L", the N-channel type MOS transistor N11 is turned OFF to cut the flow path of electric current so that the electric potential of the junction A of the resistor R11 and the P-channel type MOS transistor is pulled up to "HH" by the resistor R11 and, if (Vpp−VMP)>|VTP|, the P-channel type MOS transistor P12 is turned ON to raise the output inversion signal $\overline{OUT11}$ to "HH". As a result, the electric potential of the junction B of the N-channel type MOS transistors N11 and N12 is pulled up to (VMN−VTN) by way of the N-channel type MOS transistor N12 to put it into a stable condition.

If, on the other hand, the input signal IN1 is at "H", the N-channel type MOS transistor N11 is turned ON to bring the junction B of the N-channel type MOS transistor to "L" and, if VMN>VTN, the N-channel type MOS transistor N12 is also turned ON to bring the output inversion signal $\overline{OUT11}$ to "L". As a result, the electric potential of the junction A is pulled down to (VMP+|VTP|) by way of the P-channel type MOS transistor P12 to put it into a stable condition.

As described above, with the first embodiment of FIG. 1A, the high voltage is controlled by an input signal IN1 having an amplitude shiftable between VDD and GND to produce an output inversion signal $\overline{OUT11}$ at "L" or "HH".

A maximum voltage (Vpp−VMP−|VTP|) is applied to the resistor R11 and a maximum voltage of (VMP+|VTP|) is applied between the drain and the source of the P-channel type MOS transistor P12, maximum voltages of (VMN−VTN) and (Vpp−VMN−VTN) are respectively applied between the drain and the source of the N-channel type MOS transistor N11 and of the N-channel type MOS transistor N12 so that, by setting the values of VMP and VMN close to Vpp/2, no voltage as high as Vpp is applied between the drain and the source of any of the MOS transistors and, therefore, it is not necessary to design the resistor R11, the P-channel type MOS transistor P12 and the N-channel type MOS transistors N11 and N12 to make them withstand a high voltage. Consequently, the problem of a complicated manufacturing process and high manufacturing cost can be resolved.

Additionally, since the gate oxide films of the P-channel type MOS transistor P12, the N-channel type MOS transistors N11 and 12 are respectively subjected to maximum voltages of (Vpp−VMP), VDD and VMN, they are relieved of being subjected to a strong electric field if a value close to Vpp/2 is selected for VMP and VMN so that the problem of degradation and eventual destruction of the gate oxide films and malfunctioning of the circuit can effectively be avoided.

Figure 13:
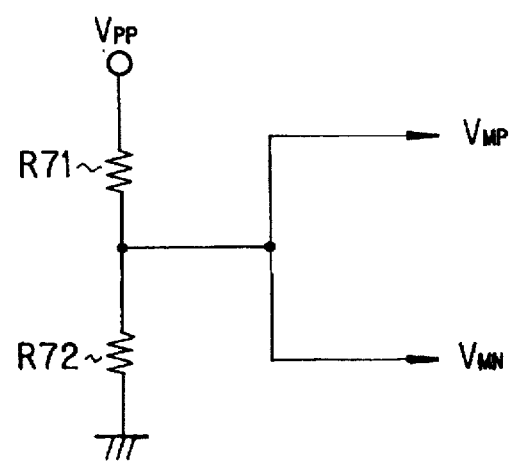
FIG. 13 illustrates a circuit for generating VMP and VMN.
Figure 14A:
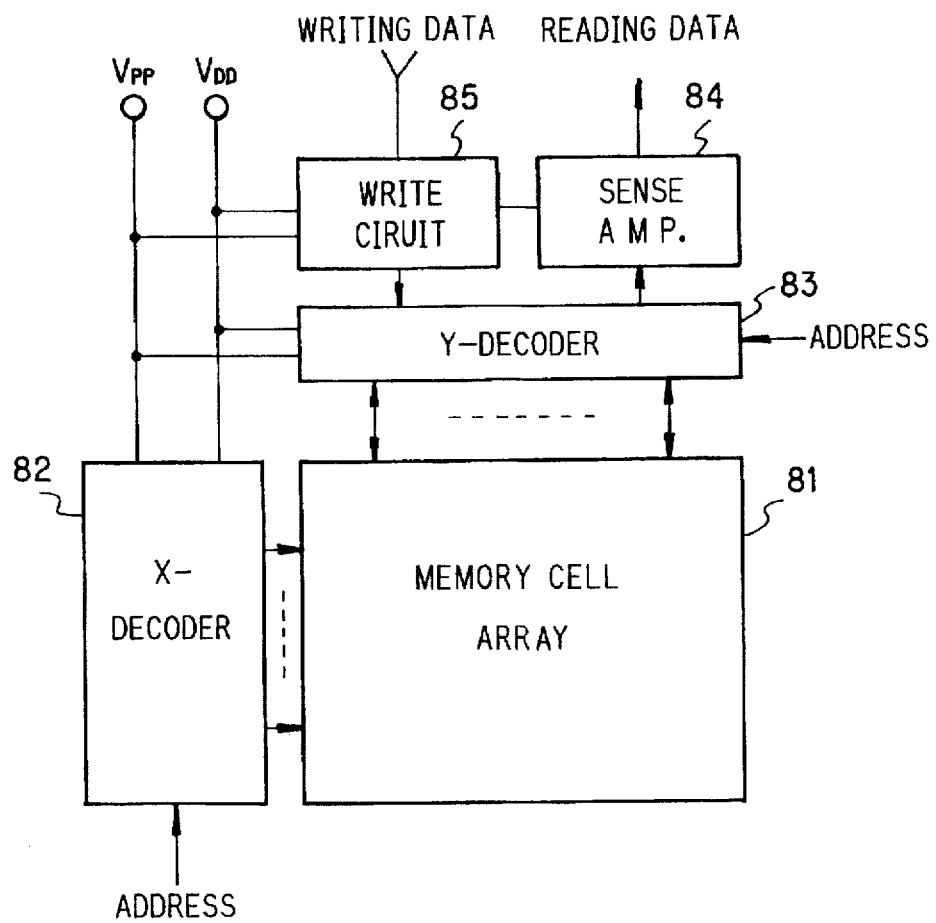
FIGS. 14A and 14B are a circuit diagram of a nonvolatile memory and a memory cell.
Figure 14B:
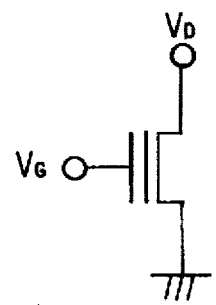

FIG. 13 shows a circuit for producing VMP and VMN, which will not be described here any further because such a circuit has already been described earlier. While VMP=VMN in the above embodiment, it will be clear that a relationship of VMP≠VMN may also be feasible so long as they are close to Vpp/2.

Figures 2A, 2B:
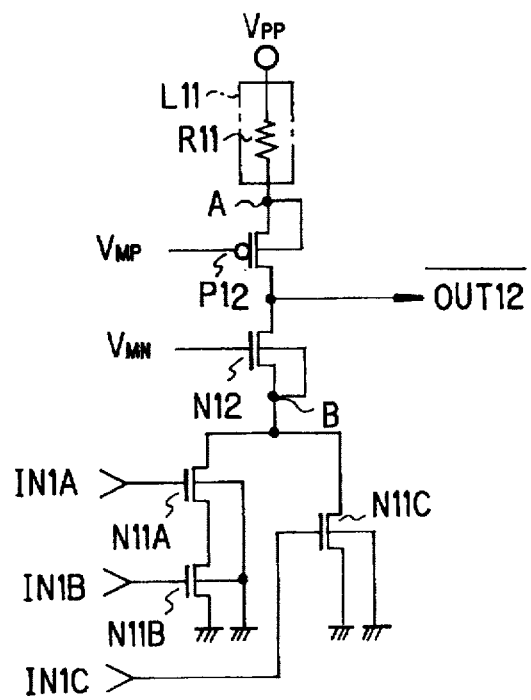
FIGS. 2A and 2B are a circuit diagram of a second embodiment and a timing chart for explaining the operation thereof according to the present invention.

FIG. 2A is a circuit diagram of a second embodiment according to the present invention which is similar to the first embodiment of FIG. 1A, although they differ from each other in that the substrate electrodes of the P-channel type MOS transistor P12 and the N-channel type MOS transistor N12 of the first embodiment are connected to the respective sources of the transistors in this embodiment. Additionally, the N-channel type MOS transistor N11 of FIG. 1A is replaced by an N-channel type MOS transistor N11A having a gate to which an input signal IN1A is applied, another N-channel type MOS transistor N11B having a gate to which an input signal IN1B is applied, the transistors N11a and N11B being connected in series, and still another N-channel type MOS transistor N11C having a gate to which an input signal IN1C is applied, the transistor N11C being connected in parallel with the transistors N11A and N11B to form a logic circuit.

The remaining components of this embodiment are the same as those of the first embodiment and therefore they are respectively denoted by the same reference symbols and will not be described here any further.

The above described circuit of the second embodiment operates in a manner as described below by referring to FIG. 2B. Like the first embodiment of the invention, if either or both of the gates of the N-channel type MOS transistors N11A and N11B connected in series are brought "L" and turned OFF, and the gate of the N-channel type MOS transistor N11C is brought to "L" and turned OFF to cut the flow path of electric current, the output inversion signal $\overline{OUT12}$ comes to "HH". Applying "H" to the gates of the N-channel type MOS transistors N11A and N11B to turn them ON or apply "HH" to the gate of the N-channel type MOS transistor N11C to turn it ON in order to establish a flow path of electric current, brings the output inversion signal $\overline{OUT12}$ to "L".

Otherwise, the circuit operates the same as that of the first embodiment and, therefore, a detailed description of the operation of the circuit will be omitted here.

As may be apparent from the above description, the second embodiment of the present invention shown in FIG. 2A provides, in addition to the advantages of the first embodiment, an advantage that the circuit operates properly even if the withstanding voltage between the drain and the source is lower than Vpp since the substrate electrodes of the P-channel type MOS transistor P12 and the N-channel type MOS transistor N12 are connected to the respective sources so that maximum voltages of only (VMP+|VTP|) and (Vpp−VMN+VTN) are respectively applied between the drain and the source of the transistor P12 and of the transistor N12 and they are free from the high voltage of Vpp between the drain and the source. In addition, this embodiment has another advantage that the output inversion signal $\overline{OUT12}$ can be obtained by controlling the high voltage by means of input signals IN1A, IN1B and IN1C having an amplitude shiftable between VDD and GND and according to a logic expressed by negation of (IN1A·IN1B+IN1C). It will be understood that the logic circuit of the above embodiment may be modified appropriately without losing the effect of controlling the high voltage.

Figure 3A:
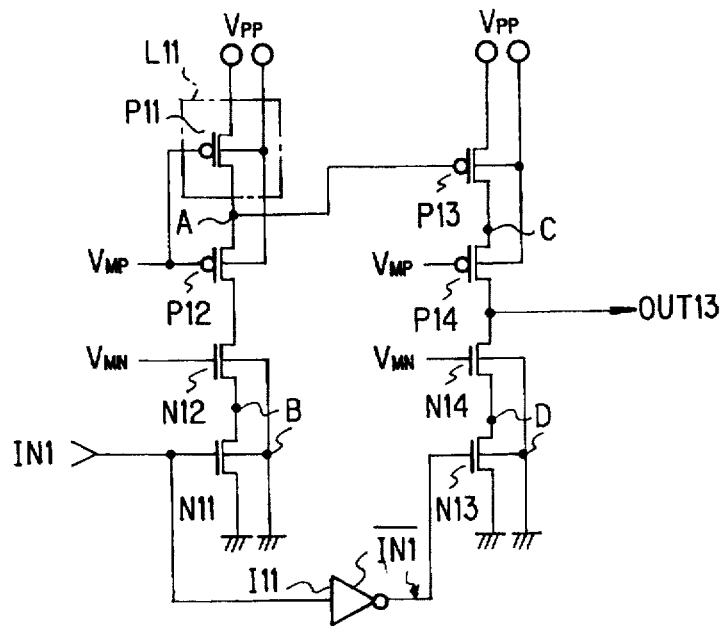
FIGS. 3A and 3B are a circuit diagram of a third embodiment and a timing chart for explaining the operation thereof according to the present invention.

FIG. 3A is a circuit diagram of a third embodiment of the invention. This embodiment differs from the first embodiment of FIG. 1A in that the load device L11 here is a P-channel type MOS transistor P11 having a gate to which VMP is applied and it additionally comprises a P-channel type MOS transistor P13 having a gate connected to the junction of the P-channel type MOS transistors P11 and P12, another P-channel type MOS transistor P14 having a gate to which a voltage VMP close to the level of Vpp/2 is applied, an N-channel type MOS transistor N14 having a gate to which a voltage VMN close to the level of Vpp/2 is applied and another N-channel type MOS transistor N13 having a gate to which an input inversion signal $\overline{IN1}$ obtained by inverting an input signal IN1 by means of an inverter I11 is applied. The MOS transistors P13, P14, N14 and N13 are connected in series to form a serial circuit. Additionally, the substrate electrode of the P-channel type MOS transistor P14 is connected to the high voltage supply terminal Vpp and that of the N-channel type MOS transistor N14 is connected to the grounding terminal GND so that an output signal OUT13 may be taken out of the junction of the P-channel type MOS transistor P14 and the N-channel type MOS transistor N14.

Figure 3B:
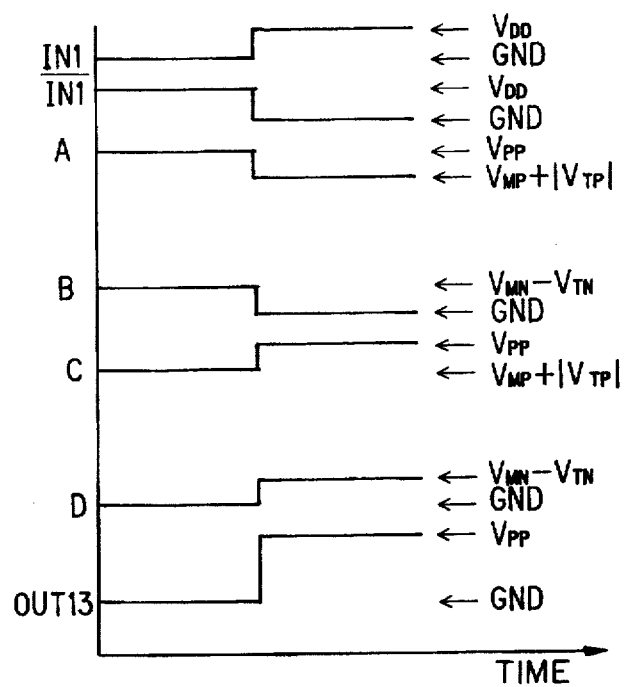

The above described circuit of the third embodiment operates in a manner as described below by referring to FIG. 3B. Note that the P-channel type MOS transistor P11 functions as a load device like a resistor because the P-channel type MOS transistor is turned ON as a voltage VMP close to Vpp/2 is applied to its gate so that the first serial circuit constituted by the P-channel type MOS transistors P11 and P12 and the N-channel type MOS transistors N11 and N12 operates exactly the same as its counterpart of the first embodiment. Therefore, only changes in the electric potentials of the junctions A and B are illustrated in FIG. 3B and the operation of the first serial circuit will not be described here any further.

If the input signal IN1 is at "L", the inverted input inversion signal $\overline{IN1}$ is at "H" to turn ON the N-channel type MOS transistor N13 to pull down the junction D of the N-channel type MOS transistors N13 and N14 to "L". Furthermore, if VMN>VTN, the N-channel type MOS transistor N14 is also turned ON to bring the output signal OUT13 to "L" and raise the electric potential of the junction A to "HH" so that the P-channel type MOS transistor P13 is turned OFF and the electric potential of the junction C of the P-channel type MOS transistors P13 and P14 is pulled down to (VMP+|VTP|) by way of the P-channel type MOS transistor P14 to put it into a stable condition.

If, on the other hand, the input signal IN1 is at "H", the electric potential of the junction A is made equal to (VMP+|VTP|). Therefore, if (Vpp−VMP−|VTP|)>|VTP|, the P-channel type MOS transistor P13 is turned ON to pull up the junction C to "HH", whereas, if (Vpp−VMP)>51 VTP|, the P-channel type MOS transistor P14 is also turned ON to raise the output inversion signal $\overline{OUT13}$ to "HH" and, at the same time, the inverted input inversion signal $\overline{IN1}$ of the input signal IN1 goes to "L" to turn OFF the N-channel type MOS transistor N13 so that the junction D of the N-channel type MOS transistors N13 and N14 is pulled up to (VMN−VTN) by way of the N-channel type MOS transistor N14 to put it into a stable condition.

As described above, since a maximum voltage of (Vpp−VMP−|VTP|) is applied between the drain and the source of the P-channel type MOS transistor P11 and of the P-channel type MOS transistor P13 and a maximum voltage of (VMP+|VTP|) is applied between the drain and the source of the P-channel type MOS transistor P12 and of the P-channel type MOS transistor P14, while a maximum voltage of (VMN−VTN) is applied between the drain and the source of the N-channel type MOS transistor N11 and of the N-channel type MOS transistor N13 and a maximum voltage of (Vpp−VMN+VTN) is applied between the drain and the source of the N-channel type MOS transistor N12 and of the N-channel type MOS transistor N14, no voltage as high as Vpp is applied between the drain and the source of any of the MOS transistors and, therefore, it is not necessary to design the P-channel type MOS transistors P11, P12, P13 and P14 and the N-channel type MOS transistors N11, N12, N13 and N14 to make them withstand a high voltage.

Therefore, the problem of a complicated manufacturing process and high manufacturing cost can be resolved and the gate oxide films of the P-channel type MOS transistors P11, P12 and P14 are only subjected to a maximum voltage of (Vpp−VMP) and that of the P-channel type MOS transistor P13 is subjected to a maximum voltage of (Vpp−VMP−51 VTP|), while the gate oxide films of the N-channel type MOS transistors N11 and N13 are subjected to a maximum voltage of VDD and those of the N-channel type MOS transistors N12 and N14 are subjected to a maximum voltage of VMN. Thus, the MOS transistors are relieved of being subjected to a strong electric field if a value close to Vpp/2 is selected for VMP and VMN so that the problem of degradation and eventual destruction of the gate oxide films and malfunctioning of the circuit can effectively be avoided. Additionally, the circuit does not consume power at an enhanced rate if a high drive capacity is designed for the circuit in order to complementarily turn ON and OFF the P-channel type MOS transistor P13 and the N-channel type MOS transistor N13 of the above embodiment. Therefore, the embodiment is accompanied by an additional advantage of being capable of driving a high capacity load at a high speed without consuming electric power at an enhanced rate.

Figure 4:
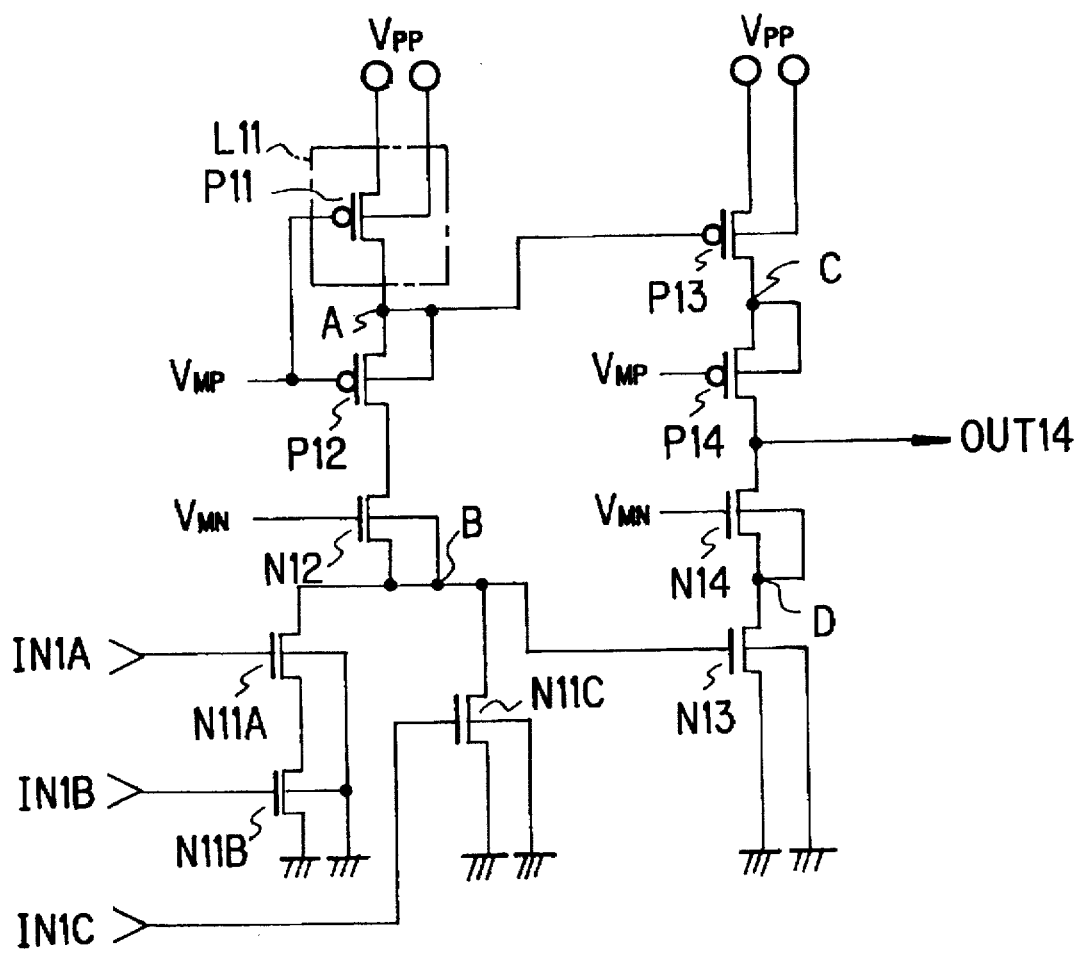
FIG. 4 is a circuit diagram of a fourth embodiment according to the present invention.

FIG. 4 is a circuit diagram of a fourth embodiment of the invention. This embodiment is realized by adding a second serial circuit same as that of the third embodiment comprising P-channel type MOS transistors P13 and P14 and N-channel type MOS transistors N13 and N15 to the circuit of the second embodiment. The substrate electrodes of the P-channel type MOS transistors P12 and P14 are respectively connected to the sources of the P-channel type MOS transistors P12 and P14, while the substrate electrodes of the N-channel type MOS transistors N12 and 14 are respectively connected to the sources of the N-channel type MOS transistors N12 and N14, whereas the gate of the N-channel type MOS transistor N13 is connected to the junction B of a logic circuit constituted by the N-channel type MOS transistors N12, N11A, N11B and N11C and an output signal OUT14 is taken out of the junction of the P-channel type MOS transistor P14 and the N-channel type MOS transistor N14. Otherwise, the remaining components of the embodiment are the same as those of the second and third embodiments so that they are denoted by the same reference symbols and will not be described here any further.

As for the operation of this embodiment, since a signal is inverted by a serial circuit constituted by the P-channel type MOS transistors P13 and P14 and the N-channel type MOS transistors N13 and N14, the output signal OUT14 is obtained by inverting the output inversion signal $\overline{OUT12}$ of FIG. 2B or by replacing "HH" wit "L" and "L" with "HH" in FIG. 2B. Otherwise, the circuit operates exactly same as the second and third embodiments and, therefore, will not be described here any further.

Thus, no voltage as high as Vpp is applied between the drain and the source of any of the MOS transistors of the embodiment of FIG. 4 and, therefore, it is not necessary to design the MOS transistors to make them withstand a high voltage. Consequently, the problem of a complicated manufacturing process and high manufacturing cost can be resolved and that of degradation and eventual destruction of the gate oxide films and malfunctioning of the circuit can also be effectively avoided. Additionally, the high voltage can be controlled by an input signal having an amplitude shiftable between VDD and GND so that the embodiment is accompanied by an additional advantage of being capable of driving a high capacity load at a high speed without consuming electric power at an enhanced rate.

Still additionally, since the substrate electrodes of the P-channel type MOS transistors P12 and P14 and those of the N-channel type MOS transistors N12 and N14 are connected to the respective sources, the circuit operates properly if the MOS transistors are designed only to withstand a voltage lower than Vpp between the drain and the source. Finally, since the gate of the N-channel type MOS transistor N13 is connected between the N-channel type MOS transistor N12 and the logic circuit constituted by the N-channel type MOS transistors N11A, N11B and N11C, the embodiment is accompanied by a still another advantage that a circuit for inverting input signals IN1A, IN1B and IN1C to make a logic hold true is not required.

Figure 5A:
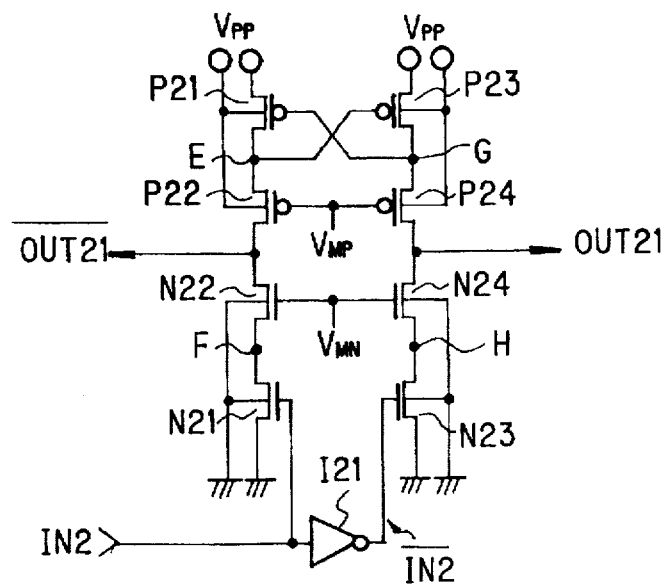
FIGS. 5A and 5B are a circuit diagram of a fifth embodiment and a timing chart for explaining the operation thereof according to the present invention.

FIG. 5A is a circuit diagram of a fifth embodiment of the present invention comprising a serial circuit realized by connecting in series a P-channel type MOS transistor P21, a P-channel type MOS transistor having a gate to which a voltage VMP close to Vpp/2 is applied, an N-channel type MOS transistor N22 having a gate to which a voltage VMN close to Vpp/2 is applied and an N-channel type MOS transistor N21 having a gate to which an input signal IN2 is applied, between Vpp and GND.

The circuit further comprises another serial circuit realized by connecting in series a P-channel type MOS transistor P23, a P-channel type MOS transistor P24 having a gate to which a voltage VMP close to Vpp/2 is applied, an N-channel type MOS transistor N24 having a gate to which a voltage VMN close to Vpp/2 is applied and an N-channel type MOS transistor N23 having a gate to which an input inversion signal $\overline{IN2}$ obtained by inverting an input signal IN2 by means of an inverter I21, between Vpp and GND.

The gate of the P-channel type MOS transistor P21 is connected to the junction G of the P-channel type MOS transistors P23 and P24 and the gate of the P-channel type MOS transistor P23 is connected to the junction E of the P-channel type MOS transistors P21 and P22, while the substrate electrodes of the P-channel type MOS transistors P22 and P24 are connected to Vpp and those of the N-channel type MOS transistors N22 and N24 are connected to GND so that a pair of complementary output signals OUT21 may be taken out of the junction of the P-channel type MOS transistor P22 and the N-channel type MOS transistor N22 and that of the P-channel type MOS transistor P24 and the N-channel type MOS transistor N24.

Figure 5B:
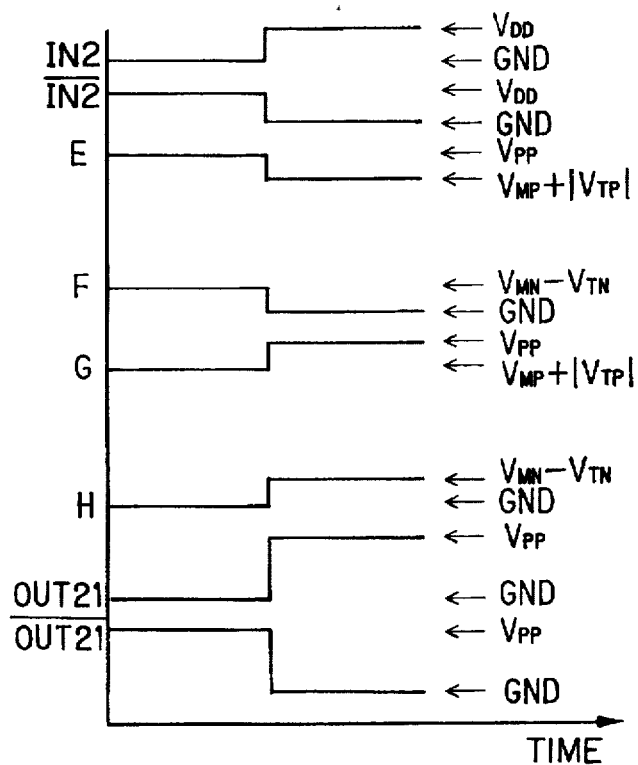

The above described embodiment operates in a manner as described below by referring to FIG. 5B. If the input signal IN2 is at "L", the N-channel type MOS transistor N21 is turned OFF and, at the same time, the inverted input inversion signal $\overline{IN2}$ is raised to "H" to turn ON the N-channel type MOS transistor N23 and pull down the junction H of the N-channel type MOS transistors N23 and N24 to "L". Furthermore, if VMN>VTN, the N-channel type MOS transistor N24 is also turned ON to bring down the output signal OUT21 to "L" so that the electric potential of the junction G is pulled down to (VMP+|VTP|) by way of the P-channel type MOS transistor P24 to put it into a stable condition.

If (Vpp−VMP−|VTP|)>|VTP|, the P-channel type MOS transistor P21 is turned ON to pull up the junction F to "HH" and turn OFF the P-channel type MOS transistor P23, whereas, if (Vpp−VMP)>|VTP|, the P-channel type MOS transistor P22 is also turned ON to raise the output inversion signal $\overline{OUT21}$ to "HH" so that the junction F of the N-channel type MOS transistors N21 and N22 is pulled up to (VMN−VTN) by way of the N-channel type MOS transistor N22 to put it into a stable condition.

If, on the other hand, the input signal IN1 is at "H", the N-channel type MOS transistor N21 is turned ON to pull down the junction F to "L". Furthermore, if VMN>VTN, the N-channel type MOS transistor N22 is also turned ON to bring down the output inversion signal $\overline{OUT21}$ to "L" so that the electric potential of the junction E is pulled down to (VMP+|VTP|) by way of the P-channel type MOS transistor P22 to put it into a stable condition and, at the same time, the inverted input inversion signal $\overline{IN2}$ becomes "L" to turn OFF the N-channel type MOS transistor N23.

If (Vpp−VMP−|VTP|)>|VTP|, the P-channel type MOS transistor P23 is turned ON to pull up the junction G to "HH" and turn OFF the P-channel type MOS transistor P21, whereas, if (Vpp−VMP)>|VTP|, the P-channel type MOS transistor P24 is also turned ON to raise the output signal OUT21 to "HH" so that the junction H is pulled up to (VMN−VTN) by way of the N-channel type MOS transistor N24 to put it into a stable condition.

As described above, with the fifth embodiment of FIG. 5A, the high voltage is controlled by means of an input signal IN2 having an amplitude shiftable between VDD and GND to obtain a pair of complementary output signals and $\overline{OUT21}$. Thus, a maximum voltage of (Vpp−VMP−|VTP|) is applied between the drain and the source of the P-channel type MOS transistor P21 and of the P-channel type MOS transistor P23 and a maximum voltage of (VMP−|VTP|) is applied between the drain and the source of the P-channel type MOS transistor P22 and of the P-channel type MOS transistor P24, while a maximum voltage of (VMN−VTN) is applied between the drain and the source of the N-channel type MOS transistor N21 and of the N-channel type MOS transistor N23 and a maximum voltage of (Vpp−VMN+VTN) is applied between the drain and the source of the N-channel type MOS transistor N22 and of the N-channel type MOS transistor N24.

Thus, no voltage as high as Vpp is applied between the drain and the source of any of the MOS transistors if values close to Vpp/2 are selected respectively for VMP and VMN and, therefore, it is not necessary to design the MOS transistors so as to make them withstand a high voltage between the drain and the source. Therefore, the problem of a complicated manufacturing process and high manufacturing cost can be resolved.

Additionally, the gate oxide films of the P-channel type MOS transistors P21 and P23 are subjected to a maximum voltage of (Vpp−VMP−|VTP|) and those of the P-channel type MOS transistors P22 and P24 are subjected to a maximum voltage of (Vpp−VMP), while the gate oxide films of the N-channel type MOS transistors N21 and N23 are subjected to a maximum voltage of VDD and those of the N-channel type MOS transistors N22 and N24 are subjected to a maximum voltage of VMN.

Thus, the MOS transistors are relieved of being subjected to a strong electric field if a value close to Vpp/2 is selected for VMP and VMN so that the problem of degradation and eventual destruction of the gate oxide films and malfunctioning of the circuit can effectively be avoided. Additionally, since the P-channel type MOS transistor P21 and the N-channel type MOS transistor N21 and the P-channel type MOS transistor P23 and the N-channel type MOS transistor N23 are complementarily turned ON and OFF, the circuit does not consume power at an enhanced rate.

Figure 6A:
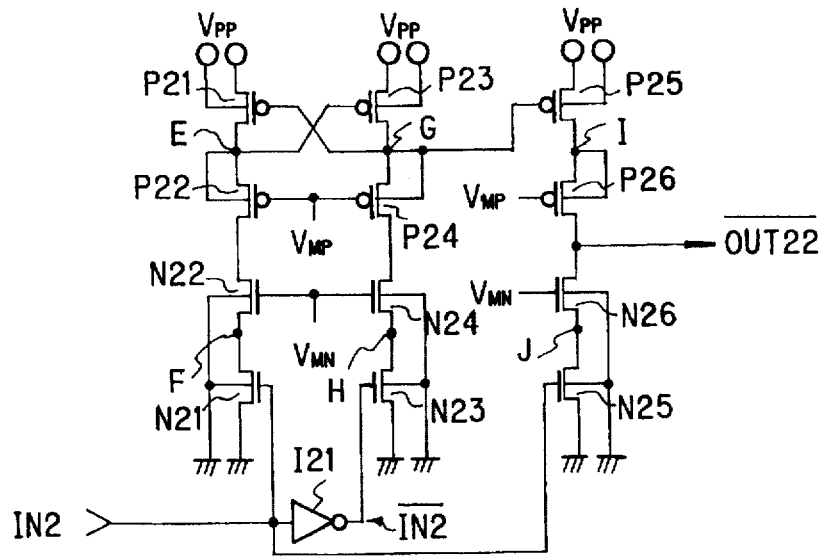
FIGS. 6A and 6B are a circuit diagram of a sixth embodiment and a timing chart for explaining the operation thereof according to the present invention.

FIG. 6A is a circuit diagram of a sixth embodiment according to the present invention, which differs from the above described fifth embodiment in that additionally comprises a serial circuit realized by connecting in series a P-channel type MOS transistor P25 having a gate connected to the junction G, a P-channel type MOS transistor P26 having a gate to which a voltage of VMP of a level close to Vpp/2 is applied, an N-channel type MOS transistor N26 also having a gate to which a voltage of VMN of a level close to Vpp/2 is applied and an N-channel type MOS transistor N25 having a gate to which an input signal IN2 is applied between Vpp and GND.

The substrate electrodes of the P-channel type MOS transistors P22, P24 and P26 are respectively connected to the sources of the P-channel type MOS transistors P22, P24 and P25 and an output inversion signal $\overline{OUT22}$ is taken out of the junction of the P-channel type MOS transistor P26 and the N-channel type MOS transistor N26. Otherwise, the sixth embodiment is identical with the fifth embodiment and, therefore, the remaining components are denoted by the same reference symbols and will not be described here any further.

Figure 6B:
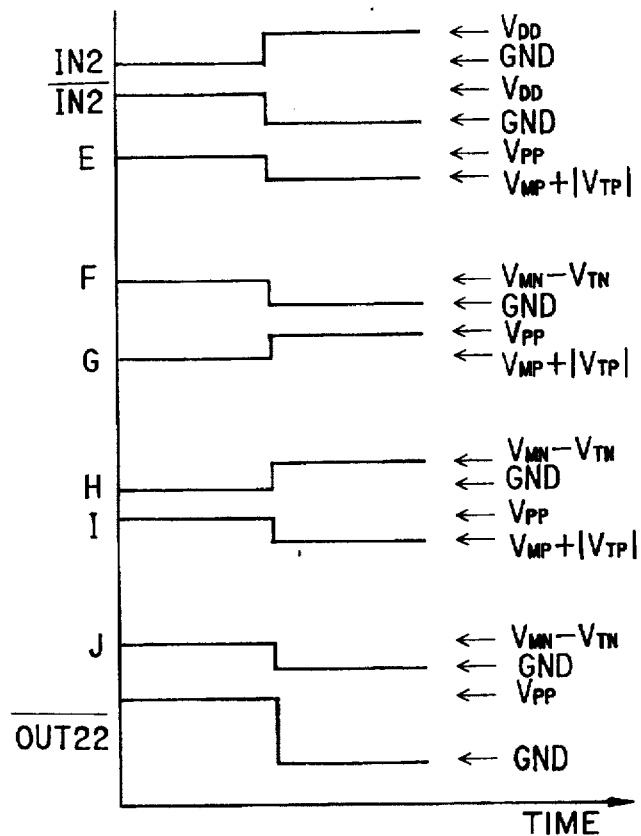

The above described embodiment operates in a manner as described below by referring to FIG. 6B. Since the behaviors of the junctions E, F, G and H of this embodiment are the same as those of their counterparts of the fifth embodiment in terms of electric potential, they are shown in FIG. 6B and will not be described here any further.

Firstly, if the input signal IN2 is at "L", the N-channel type MOS transistor N25 is turned OFF and, at the same time, the junction I of the P-channel type MOS transistors P25 and P26 is pulled up to "HH" if (Vpp−VMP−|VTP|) >|VTP| because the junction G has an electric potential of (VMP+|VTP|). If (Vpp−VMP)>|VTP51|, the P-channel type MOS transistor P26 is also turned ON to bring the output inversion signal $\overline{OUT22}$ up to "HH" so that the electric potential of the junction J of the N-channel type MOS transistor N25 and N26 is pulled down to (VMN−VTN) by way of the N-channel type MOS transistor N26 to put it into a stable condition.

If, on the other hand, the input signal IN2 is at "H", the N-channel type MOS transistor N25 is turned ON to pull down the junction J to "L". Furthermore, if VMN>VTN, the N-channel type MOS transistor N26 is also turned ON to bring down the output inversion signal $\overline{OUT22}$ to "L" so that the electric potential of the junction I is pulled down to (VMP+|VTP|) by way of the P-channel type MOS transistor P26 to put it into a stable condition because the junction G is at "HH" and the P-channel type MOS transistor P25 is turned OFF.

As described above, with the sixth embodiment of FIG. 6A, the high voltage is controlled by means of an input signal IN2 having an amplitude shiftable between VDD and GND to obtain an output inversion signal $\overline{OUT22}$ that is inverted in terms "L" and "HH". Thus, a maximum voltage of (Vpp−VMP−|VTP|) is applied between the drain and the source of the P-channel type MOS transistor P25 and a maximum voltage of (VMP+|VTP|) is applied between the drain and the source of the P-channel type MOS transistor P26, while a maximum voltage of (VMN+VTN) is applied between the drain and the source of the N-channel type MOS transistor N25 and a maximum voltage of (Vpp−VMN+VTN) is applied between the drain and the source of the N-channel type MOS transistor N26.

Thus, no voltage as high as Vpp is applied between the drain and the source of any of the MOS transistors if values close to Vpp/2 are selected respectively for VMP and VMN and, therefore, it is not necessary to design the MOS transistors so as to make them withstand a high voltage between the drain and the source. Therefore, the problem of a complicated manufacturing process and high manufacturing cost can be resolved.

Additionally, the gate oxide films of the P-channel type MOS transistor P25 is only subjected to a maximum voltage of (Vpp−VMP−|VTP|) and that of the P-channel type MOS transistor P26 is subjected to a maximum voltage of (Vpp−VMP), while the gate oxide films of the N-channel type MOS transistors N25 and N26 are subjected to respective maximum voltage of VDD and VMN.

Thus, the MOS transistors are relieved of being subjected to a strong electric field if a value close to Vpp/2 is selected for VMP and VMN so that the problem of degradation and eventual destruction of the gate oxide films and malfunctioning of the circuit can effectively be avoided.

Additionally, since substrate electrodes of the P-channel type MOS transistors P22 and P24 are connected to the respective sources, the maximum voltage to be applied between the drain and the source of the P-channel type MOS transistor P22 and of the P-channel type MOS transistor P24 is suppressed to (VMP+HVTPI), the circuit operates properly if the P-channel type MOS transistors P22 and P24 can only withstand a voltage less than Vpp between the drain and the substrate.

Finally, since the P-channel type MOS transistor P25 and the N-channel type MOS transistor N23 are turned ON and OFF complementarily, the circuit does not consume power at an enhanced rate if it is designed to have a large driving force.

Figure 7:
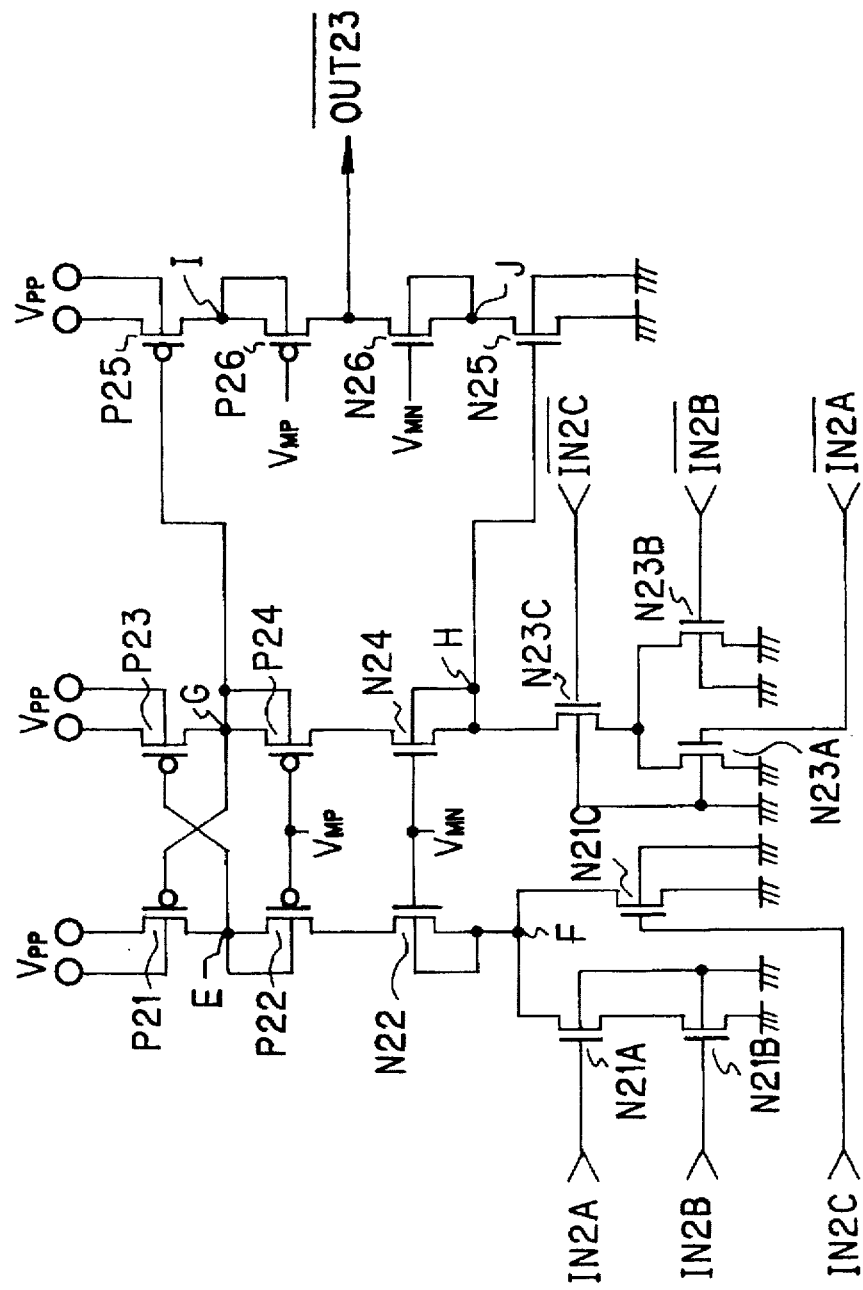
FIGS. 7 is a circuit diagram of a seventh embodiment according to the present invention.
Figure 8A:
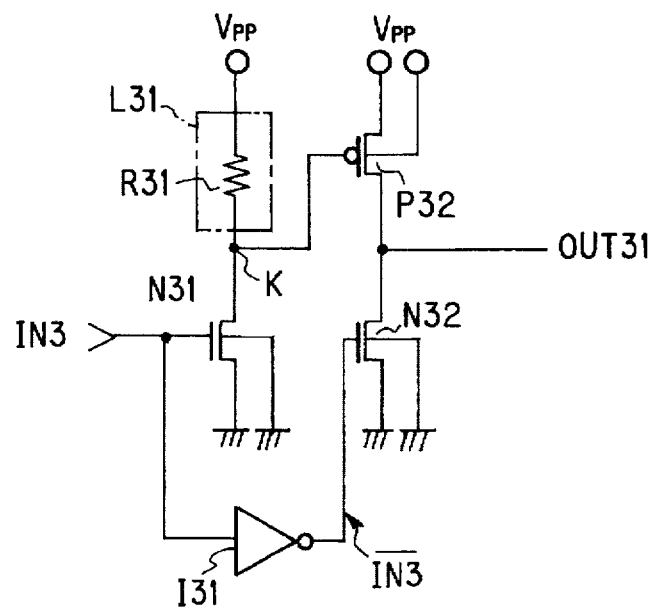
FIGS. 8A and 8B are a first conventional circuit diagram of a voltage level shift circuit and a timing chart for explaining the operation thereof.
Figure 8B:
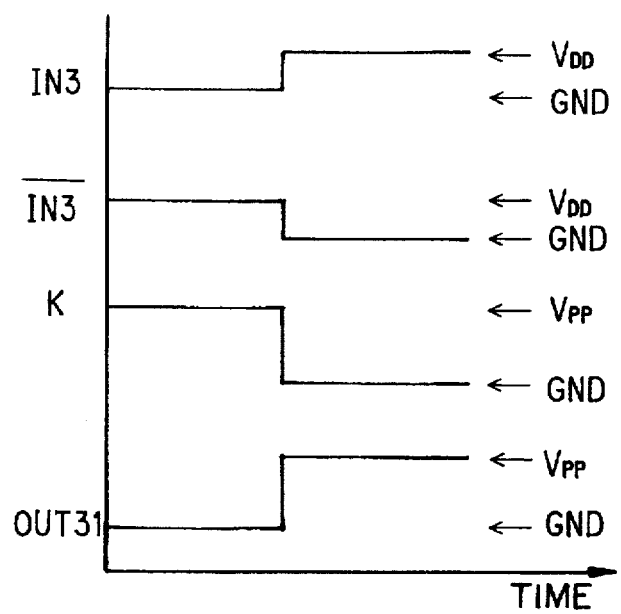
Figure 9A:
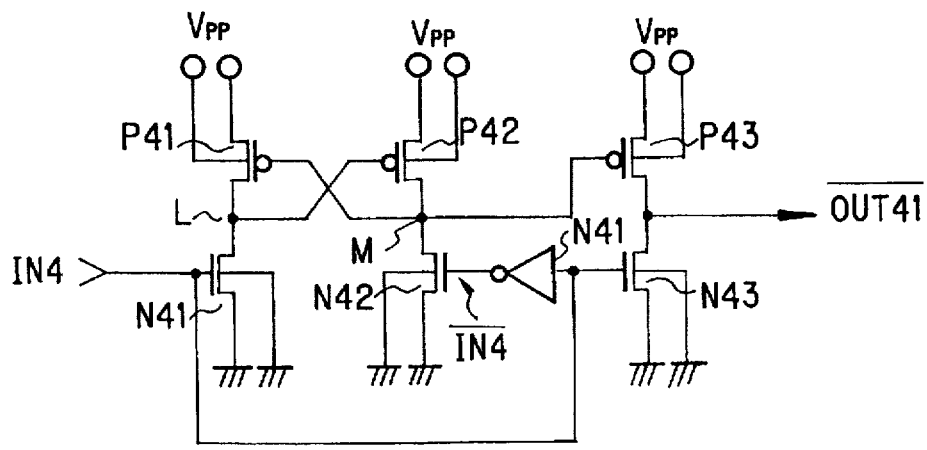
FIGS. 9A and 9B are a second conventional circuit diagram of a voltage level shift circuit and a timing chart for explaining the operation thereof.
Figure 9B:
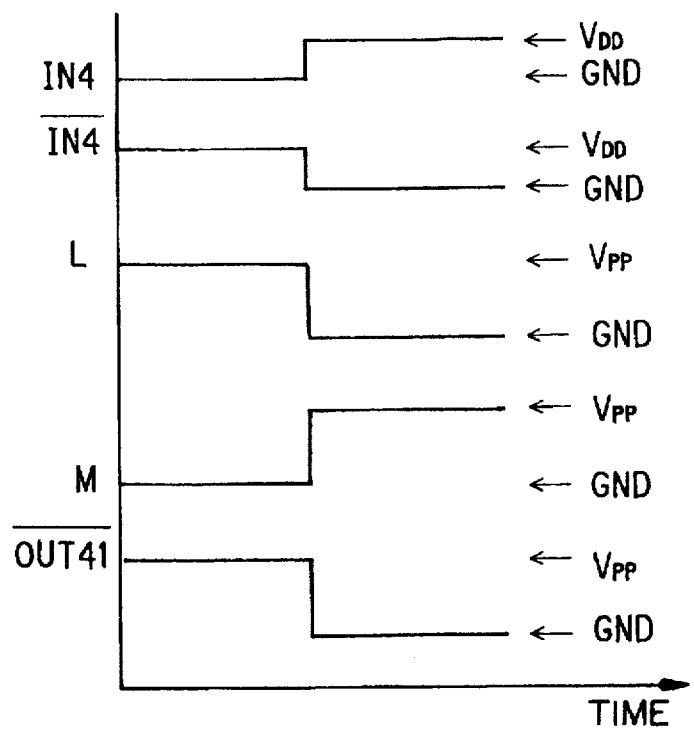
Figure 10A:
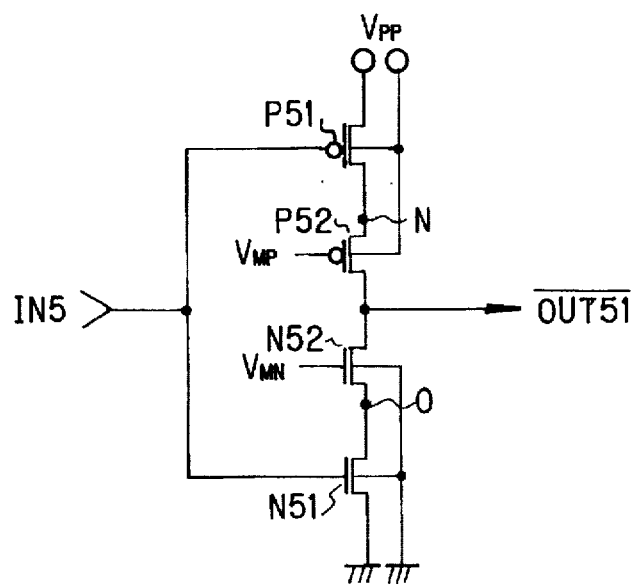
FIGS. 10A and 10B are a third conventional circuit diagram of a voltage level shift circuit and a timing chart for explaining the operation thereof.
Figure 10B:
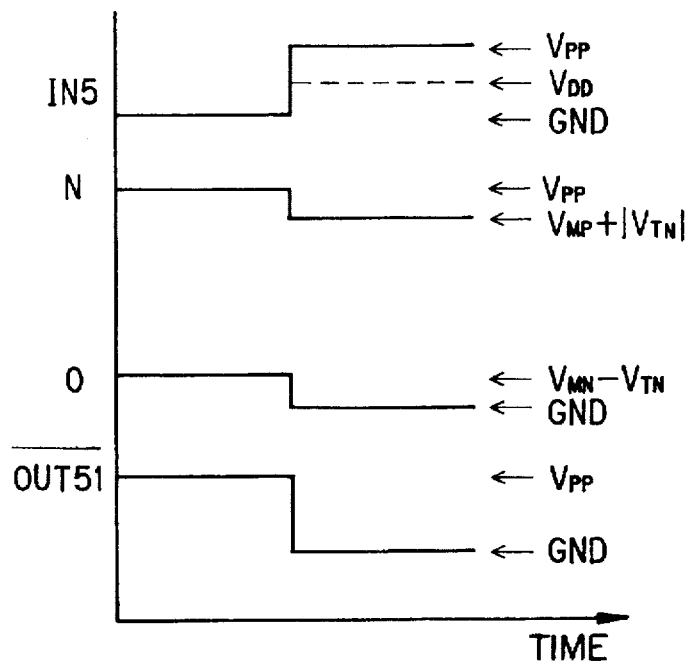
Figure 11A:
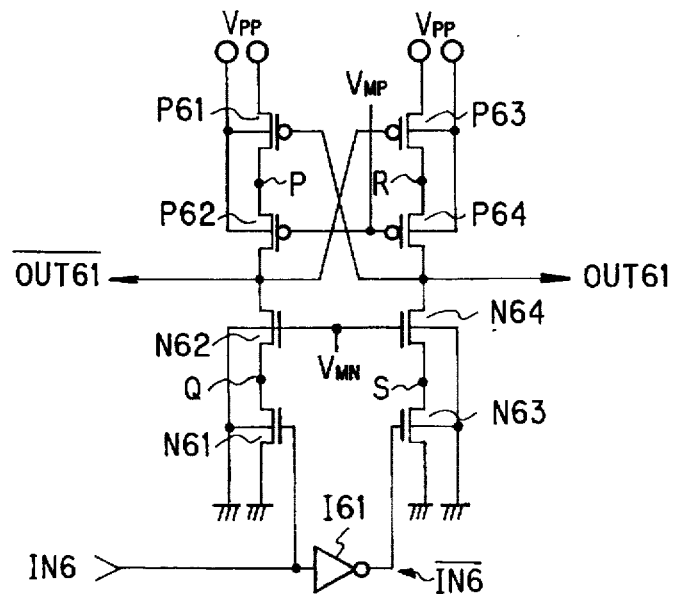
FIGS. 11A and 11B are a fourth conventional circuit diagram of a voltage level shift circuit and a timing chart for explaining the operation thereof.
Figure 11B:
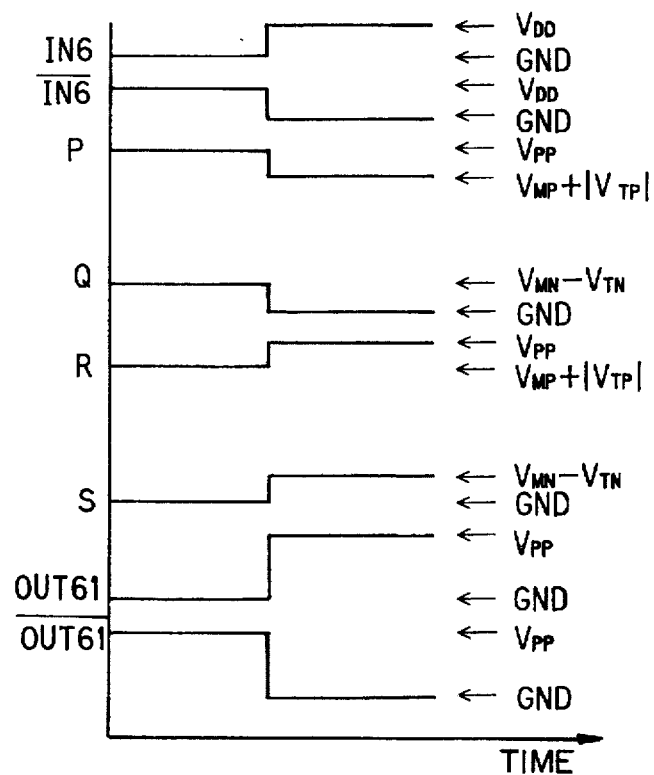
Figure 12:
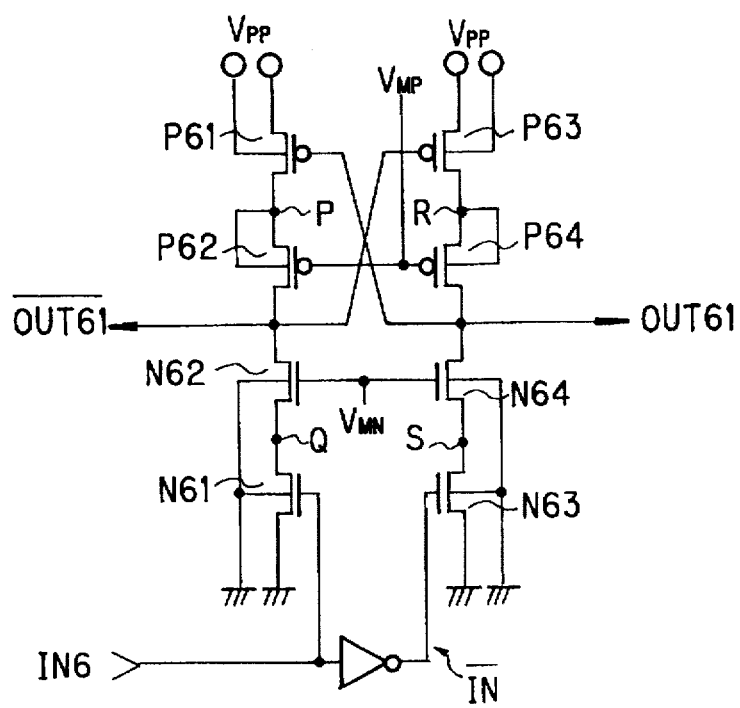
FIG. 12 is a fifth conventional circuit diagram of a voltage level shift circuit.

FIG. 7 is a circuit diagram of a seventh embodiment according to the present invention, which is realized by respectively connecting the substrate electrodes of the N-channel type MOS transistors N22, N24 and N26 of the sixth embodiment to the sources of the N-channel type MOS transistors N22, N24 and N26 and replacing the N-channel type MOS transistor N21 of the sixth embodiment with a logic circuit realized by connecting an N-channel type MOS transistor N21A having a gate to which an input signal IN2A is applied and an N-channel type MOS transistor N21B having a gate to which an input signal IN2B is applied in series and also connecting an N-channel type MOS transistor N21C having a gate to which an input signal IN2C is applied in parallel therewith.

Additionally, the N-channel type MOS transistor N23 of the sixth embodiment is replaced by a logic circuit corresponding to the above logic circuit comprising the N-channel type MOS transistors N21A, N21B and N21C and realized by connecting an N-channel type MOS transistor N23A having a gate to which an input inversion signal $\overline{IN2A}$ obtained by inverting the input signal IN2A is applied and another N-channel type MOS transistor N23B having a gate to which an input inversion signal $\overline{IN2B}$ obtained by inverting the input signal IN2B is applied in parallel and also connecting an N-channel type MOS transistor N23C having a gate to which an input inversion signal $\overline{IN2C}$ obtained by inverting the input signal IN2C is applied in series.

Otherwise, the above described embodiment is similar to the sixth embodiment of FIG. 6A and, therefore, the remaining components of the above embodiment will not be described here any further. Additionally, since the behaviors of the junctions E through J of this embodiment are the same as those of their counterparts of the sixth embodiment shown in FIG. 6B in terms of electric potential and the output inversion signal $\overline{OUT23}$ is same as the output inversion signal $\overline{OUT12}$ of the second embodiment shown in FIG. 2B, they will not be described here any further.

The above described seventh embodiment has, in addition to the advantages of the sixth embodiment, an advantage that the maximum voltage to be applied to the N-channel type MOS transistors N22, N24 and N24 between the drain and the source is suppressed to (Vpp−VMN+VTN) because the substrate electrodes of the N-channel type MOS transistors N22, N24 and N26 are connected to their respective sources so that the circuit operates properly if the N-channel type MOS transistors N22, N24 and N26 withstand a voltage less than Vpp between the drain and the source.

It further has an additional advantage that the high voltage can be controlled by means of input signals IN2A, IN2B and IN2C shiftable between VDD and GND according to a logic expressed by inversion of (IN2A·IN2B+IN2C).

It will be understood that the logic circuit of the above embodiment may be modified appropriately without losing the effect of controlling the high voltage.

As described in detail above, according to the present invention, there can be realized a highly reliable high voltage level shift circuit that is free from degradation and eventual destruction of the gate oxide films of its MOS transistors without making the MOS transistors capable of withstanding a high voltage because the gate oxide films of the MOS transistors are not subjected to a strong electric field.

Changes in construction will occur to those skilled in the art and various apparently different modifications and embodiments may be made without departing from the scope of the invention. The matter set forth in the foregoing description and accompanying drawings is offered by way of illustration only. It is therefore intended that the foregoing description be regarded as illustrative rather than limiting.

What is claimed is:

1. A voltage level shift circuit for generating, in response to a logical input having a given level of amplitude, a logical output with an amplitude of Vpp, which is greater than the logical input, said circuit comprising:

a load device maintained in a conductive state;

a first uniconductivity type MOS transistor having a gate to which a voltage substantially equal to Vpp/2 is applied, said first uniconductivity type MOS transistor having a substrate electrode connected to a power supply voltage Vpp;

a second reverse-conductivity type MOS transistor having a gate to which a voltage substantially equal to Vpp/2 is applied; and a third reverse-conductivity type MOS transistor having a gate to which the logical input is applied, wherein the load device and the first through third MOS transistors are connected in series in the cited order between the power supply voltage Vpp and a ground and the logical output is taken out of the junction of the first and second MOS transistors.

2. A voltage level shift circuit according to claim 1, further comprising:

a fourth uniconductivity type MOS transistor having a gate connected to the junction of the load device and the first MOS transistor;

a fifth uniconductivity type MOS transistor having a gate to which a voltage substantially equal to Vpp/2 is applied;

a sixth reverse-conductivity type MOS transistor having a gate to which a voltage substantially equal to Vpp/2 is applied; and a seventh reverse-conductivity type MOS transistor having a gate to which an inverted signal of the logical input is applied, wherein the fourth through seventh MOS transistors are connected in series in the cited order between the power supply voltage Vpp and the ground and the logical output is taken out of the junction of the fifth and sixth MOS transistors instead of being taken out of the junction of the first and second MOS transistors.

3. A voltage level shift circuit according to claim 2, wherein an inverted signal of the logical output is taken out of the junction of the first and second MOS transistors.

4. A voltage level shift circuit according to claim 2, further comprising, in place of the logical input, a plurality of logical inputs, in place of the third MOS transistor, a logic circuit comprising a plurality of reverse-conductivity type MOS transistors connected in series with each other, each of said plurality of MOS transistors having a gate connected to a respective one of the plurality of logical inputs.

5. A voltage level shift circuit according to claim 2, further comprising, in place of the logical input, a plurality of logical inputs, and in place of the third MOS transistor, a logic circuit comprising a plurality of reverse-conductivity type MOS transistors connected in parallel with each other and having respective gates to which respective ones of the plurality of logical inputs are applied.

6. A voltage level shift circuit according to claim 1, further comprising, in place of the logical input, a plurality of logical inputs, and in place of the third MOS transistor, a logic circuit comprising a plurality of reverse-conductivity type MOS transistors connected in series with each other and having respective gates to which respective ones of the plurality of logical inputs are applied.

7. A voltage level shift circuit according to claim 1, further comprising, in place of the logical input, a plurality of logical inputs, and in place of the third MOS transistor, a logic circuit comprising a plurality of reverse-conductivity type MOS transistors connected in parallel with each other, each of said plurality of MOS transistors having a gate connected to a respective one of the plurality of logical inputs.

8. A voltage level shift circuit according to claim 1, wherein the load device is a resistor.

9. A voltage level shift circuit according to claim 1, wherein the load device is a MOS transistor configured to always be in an ON state during operation of said circuit.

10. A voltage level shift circuit for generating, in response to logical inputs having respective levels of amplitude, a logical output with an amplitude of Vpp, which is greater than the respective levels of amplitude of the logical inputs, said circuit comprising:

a first serial circuit, connected between a power supply voltage Vpp and a ground, the first serial circuit including:

a first uniconductivity type MOS transistor, a second uniconductivity type MOS transistor having a gate to which a voltage substantially equal to Vpp/2 is applied, a third reverse-conductivity type MOS transistor having a gate to which a voltage substantially equal to Vpp/2 is applied, and a logic circuit comprising a plurality of reverse-conductivity type MOS transistors connected in series with each other and having respective gates to which respective ones of the logical inputs are applied, wherein the first through third MOS transistors are connected in series in the cited order between the power supply voltage Vpp and the ground; and a second serial circuit, connected between the power supply voltage Vpp and the ground, the second serial circuit including:

a fifth uniconductivity type MOS transistor, a sixth uniconductivity type MOS transistor having a gate to which a voltage substantially equal to Vpp/2 is applied, a seventh reverse-conductivity type MOS transistor having a gate to which a voltage substantially equal to Vpp/2 is applied, and an eighth reverse-conductivity type MOS transistor having a gate coupled to a junction between the third MOS transistor and the logical circuit, wherein the fifth through eighth MOS transistors are connected in series in the cited order between the power supply voltage Vpp and the ground, and wherein the gate of the first MOS transistor is connected to the junction of the fifth and sixth MOS transistors and the gate of the fifth MOS transistor is connected to the junction of the first and second MOS transistors so that a pair of complementary logical outputs may be respectively taken out of the junction of the second and third MOS transistors and that of the sixth and seventh MOS transistors.

11. A voltage level shift circuit for generating, in response to logical inputs having respective levels of amplitude, a logical output with an amplitude of Vpp, which is greater than the respective levels of amplitude of the logical inputs, said circuit comprising:

a first serial circuit, connected between a power supply voltage Vpp and a ground, the first serial circuit including:

a first uniconductivity type MOS transistor, a second uniconductivity type MOS transistor having a gate to which a voltage substantially equal to Vpp/2 is applied, a third reverse-conductivity type MOS transistor having a gate to which a voltage substantially equal to Vpp/2 is applied, and a fourth reverse-conductivity type MOS transistor, wherein the first through fourth MOS transistors are connected in series in the cited order between the power supply voltage Vpp and the ground; and a second serial circuit, connected between the power supply voltage Vpp and the ground, the second serial circuit including:

a fifth uniconductivity type MOS transistor, a sixth uniconductivity type MOS transistor having a gate to which a voltage substantially equal to Vpp/2 is applied, a seventh reverse-conductivity type MOS transistor having a gate to which a voltage substantially equal to Vpp/2 is applied, and a logic circuit comprising a plurality of reverse-conductivity type MOS transistors connected in parallel with each other and having respective gates to which respective ones of the logical inputs are applied, a gate of the fourth transistor being coupled to a junction between the seventh MOS transistor and the logic circuit, wherein the fifth through seventh MOS transistors and the logic circuit are connected in series in the cited order between the power supply voltage Vpp and the ground, and wherein the gate of the first MOS transistor is connected to the junction of the fifth and sixth MOS transistors and the gate of the fifth MOS transistor is connected to the junction of the first and second MOS transistors so that a pair of complementary logical outputs may be respectively taken out of the junction of the second and third MOS transistors and that of the sixth and seventh MOS transistors.

12. A voltage level shift circuit for generating, in response to a logical input having a given level of amplitude, a logical output with an amplitude of Vpp, which is greater than the logical input, said circuit comprising:

a first serial circuit, connected between a power supply voltage Vpp and a ground, the first serial circuit including:

a first uniconductivity type MOS transistor, a second uniconductivity type MOS transistor having a gate to which a voltage substantially equal to Vpp/2 is applied, a third reverse-conductivity type MOS transistor having a gate to which a voltage substantially equal to Vpp/2 is applied, and a fourth reverse-conductivity type MOS transistor having a gate to which the logical input is applied, the first through fourth MOS transistors being connected in series in the cited order between the power supply voltage Vpp and the ground;

a second serial circuit, connected between the power supply voltage Vpp and the ground, the second serial circuit including:

a fifth uniconductivity type MOS transistor, a sixth uniconductivity type MOS transistor having a gate to which a voltage substantially equal to Vpp/2 is applied, a seventh reverse-conductivity type MOS transistor having a gate to which a voltage substantially equal to Vpp/2 is applied, and an eighth reverse-conductivity type MOS transistor having a gate to which an inverted signal of the logical input is applied, the fifth through eighth MOS transistors being connected in series in the cited order between the power supply voltage Vpp and the ground, wherein the gate of the first MOS transistor is connected to the junction of the fifth and sixth MOS transistors and the gate of the fifth MOS transistor is connected to the junction of the first and second MOS transistors; and a ninth uniconductivity type MOS transistor having a gate connected to the junction of the fifth and sixth MOS transistors;

a tenth uniconductivity type MOS transistor having a gate to which a voltage substantially equal to Vpp/2 is applied;

an eleventh reverse-conductivity type MOS transistor having a gate to which a voltage substantially equal to Vpp/2 is applied; and a twelfth reverse-conductivity type MOS transistor having a gate to which the logical input is applied, the ninth through twelfth MOS transistors being connected in series in the cited order between the power supply voltage Vpp and the ground and the logical output being taken out of the junction of the tenth and eleventh MOS transistors.

* * * * *